United States Patent [19]
Suzuki et al.

[11] Patent Number: 4,645,924
[45] Date of Patent: Feb. 24, 1987

[54] OBSERVATION APPARATUS WITH SELECTIVE LIGHT DIFFUSION

[75] Inventors: Akiyoshi Suzuki, Tokyo; Hideki Ina, Yokohama, both of Japan

[73] Assignee: Canon Kabushiki Kaisha, Tokyo, Japan

[21] Appl. No.: 553,123

[22] Filed: Nov. 18, 1983

[30] Foreign Application Priority Data

Dec. 1, 1982 [JP] Japan ................................. 57-210987

[51] Int. Cl.⁴ ............................................... H01J 3/14
[52] U.S. Cl. ............................. 250/236; 219/121 LZ
[58] Field of Search ........ 250/548, 557, 201, 234–236; 356/399, 400, 401; 350/314, 315, 6.1–6.91; 219/121 LA, 121 LZ; 372/24

[56] References Cited

U.S. PATENT DOCUMENTS 4,251,129  2/1981  Suzki et al. ........................... 350/91
4,266,876  5/1981  Nakazawa et al. ................... 356/400
4,437,758  3/1984  Suzuki ................................. 356/401

*Primary Examiner*—David C. Nelms
*Attorney, Agent, or Firm*—Fitzpatrick, Cella, Harper & Scinto

[57] ABSTRACT

An observation apparatus includes a laser beam source for producing a laser beam, a condensing optical system for constituting an optical path to condense the laser beam onto an object, a scanner for repeatedly scanning the object with the laser beam, an observation optical system for allowing an operator to observe the object, a photoreceptor for receiving the laser beam reflected by the object and producing an electric signal, a retractable refracting or diffusing optical element, across the condensing optical path, wherein the beam reflected by the object is detected by the photoreceptor when the object is scanned with the condensed laser beam, and the beam reflected by the object is observed through the observation optical system when the object is scanned with the diffused laser beam.

24 Claims, 5 Drawing Figures

OBSERVATION APPARATUS WITH SELECTIVE LIGHT DIFFUSION

BACKGROUND OF THE INVENTION

1. Field of the Invention

The present invention relates to an observation apparatus for allowing an operator to observe an object, usable with, for example, a mask aligner for manufacturing semiconductor circuits wherein a mask and wafer are to be aligned, an inspection apparatus for inspecting semiconductor devices and a microscope, or the like.

2. Description of the Prior Art

As an example of apparatus wherein two objects are automatically aligned in a predetermined positional relationship, an automatic alignment apparatus is used in manufacturing semiconductor integrated circuits. U.S. Pat. No. 4,251,129 which has been assigned to the Assignee of the present application, shows an example of such an apparatus. This is shown in FIG. 1A for the sake of explanation, wherein alignment marks on a mask 1 and a wafer 2 which are the objects to be aligned are scanned by a light spot formed by a laser beam. The electric signals produced in response to the beam reflected by the marks, more particularly, the time intervals between the signals, are used to discriminate the alignment. The apparatus contains, in addition to such a photoelectric detection system, an optical system for allowing the operator to observe the objects with his or her eyes. The observation optical system not only allows the observation of the patterns, but also plays an important role upon the scanning operation which is inevitable for the initial alignment of the mask 1.

The apparatus of FIG. 1A includes, in addition to the laser beam source 11 for producing a beam for the photoelectric detection system, a light source for the observation optical system, which is used exclusively for the observation. For this reason, the apparatus optical elements which match the wavelength of the laser beam and also that of the observation light source. The apparatus will be explained in further detail. Along the path of the laser beam L emitted from the laser source 11, for example, a He-Ne laser, there are provided a condenser lens 12 and a polygonal mirror 13 in this order. Along the optical axis X of the laser beam L deflected by the polygonal mirror 13, there are provided an f-$\theta$ lens 14, dichroic beam splitter 15 for dividing the reflected observation light out to the observation optical system, a field lens 16, a polarization beam splitter 17 for dividing the reflected alignment beam out to the photoelectric detection optical system, a relay lens 18, a beam splitter 19 for introducing the observation light into the main optical system, an aperture stop 20 and an adjacent lens 21, in the order named. At the position where the laser beam L is imaged, there is the mask 1. A pattern of the mask 1 is imaged, through the imaging optical system 22, on the wafer 2 which is placed at a position optically conjugate with the mask 1. Within the imaging optical system 22 is provided a $\lambda/4$ plate 23 which changes the state of polarization of the beam when it passes therethrough.

Along the optical axis for the reflected beam divided out by the polarization beam splitter 17, there are an imaging lens 30, a wavelength filter 31, a partial blocking plate 32, a condenser lens and a photoelectric transducer 34. The observation light from the light source 40 reaches, through a condenser lens 41, a filter 42 and a polarization plate 43, the beam splitter 19, by which it is reflected toward the objective lens 21. Along the optical axis for the observation light divided out by the dichroic beam splitter 15, there are an imaging lens 50, a filter 51 and an erector 52 to allow an operator to observe the object illuminated by the observation light.

In operation, the laser beam L emitted from the laser source 11, is condensed at the position, shown by reference character a, by a condenser lens 12, then it is incident on the polygonal mirror 13 whereby it is reflected at a right angle and also scanningly deflected in a plane of the rotation thereof. The laser beam L passes through the f-$\theta$ lens 14, the beam splitter 15 and the field lens 16, and it is again condensed at the position shown by reference numeral b, and then passed through the polarization beam splitter 17, the relay lens 18 and the beam splitter 19. The beam L further goes through the aperture stop 20 so that the principal ray of the beam L passes through the focal point c of the objective lens 21 which is located at the center of the aperture 20. Then, the beam is incident on the objective lens 21. Since the principal ray passes through the focal point c of the objective lens 21, it becomes parallel to the optical axis after it passes therethrough. The principal ray, therefore, is incident on the mask 1 perpendicularly thereto as linearly polarized light. The beam is then condensed on the wafer 2 by the imaging optical system 22, since the wafer 2 is located on the image plane of the optical system 22. At this time, the laser beam which is linearly polarized is converted to a circularly polarized beam by the $\lambda/4$ plate 23. The laser beam L incident on the mask 1 and the wafer 2 is imaged as a spot thereon by the objective lens 21, and those spots scan the mask 1 and the wafer 2 in a plane including the face of FIG. 1A in accordance with the rotation of the polygonal mirror 13. The beam L reflected by the mask 1 and the wafer 2 passes back through the $\lambda/4$ plate 23 so that the direction of polarization is changed by 90 degrees.

The beam reflected by a flat surface (specular surface) of the mask 1 and the wafer 2, that is, the surface portions other than the mark portions, is not scattered so that the reflected beam traces back on the oncoming path. The beam passes the entrance pupil at focal point c and the point adjacent it, and goes back to the beam splitter 17 via a relay lens 18. When, however, the scanning spot is incident on a non-specular part of the surface, that is, the alignment marks M1 and M2 as shown in FIG. 1B, the laser beam is reflected and scattered by the edges of the marks. The scattered light does not necessarily trace back. As shown by the dotted lines, the scattered light, after passed back through the objective lens 21, does not necessarily passes through the center of the entrance pupil, i.e., the focal point c, and goes through the marginal area thereof. This means that the scattered light and the non-scattered light are spatially separated at the pupil.

The non-scattered light, that is the light reflected by the specular surfaces of the mask 1 and the wafer 2, is directed to the beam splitter 17 through the relay lens 18 which is effective to converge the beam so as to image the beam at the point b. The beam splitter 17 divides the incident beam into a beam reflected toward the photoelectric detection system and the other beam passing therethrough toward the polygonal mirror 13.

The non-scattered light deflected toward the photoelectric detection system passes through the imaging lens 30 which is effective to establish the optical conjugate relation between the focal point b of the relay lens 18 and the partial light blocking plate 32, and through the wavelength filter 31 which allows the light for the photoelectric detection to pass through but blocks the light coming from the observation light source 40, and then images on the partial light blocking plate 32 at its center. The blocking plate 32 made of a transparent glass has its central area patterned or covered by a light blocking material. Therefore, the non-scattered light does not go beyond the blocking plate 32 to the condenser lens 33 and the photoelectric transducer 34. The scattered beam, however, does not necessarily condense on the center of the blocking plate 32 (even if it goes back along the path generally similarly to the non-scattered light), so that the scattered light reaches the photoelectric transducer 34. Thus, the photoelectric transducer 34 receives light and produces electric signal, only when the scanning laser beam illuminates the alignment mark.

The beam emitted by the observation light source 40 does not entirely pass through the polarization plate 43, but only the component of the polarization in the direction perpendicular to the polarization direction of the laser beam can be transmitted. The passed beam is then is reflected to the objective lens 21 by the beam splitter 19. The reflected beam, similarly to the laser beam, is reflected by the wafer 2, and the polarization direction is changed by 90 degrees by the λ/4 plate 23 and transmitted through the objective lens 21 toward the polygonal mirror 13, and passed through the beam splitter 19 and polarization beam splitter 17, and then reflected by the dichroic beam splitter 15. The erector 52 forms an erected image to allow observation by the human eyes. The polarization beam splitter 17 prevents the beam directly reflected by the mask 1 and incident on the objective lens 21 from being reflected toward the erector 52 so as to introduce only the beam which has reached the wafer 2. Because of this, the image can be observed as a sharp image without flare, which may otherwise be created by the light reflected by the mask 1.

In order to achieve the effective reception of the laser beam L by the photoelectric transducer 34 and the effective observation with the observation light from the observation light source 40, the characteristics of the optical element must be determined very carefully. For example, a linearly polarized laser beam is used, in which the direction of polarization is made parallel with the face of FIG. 1. That is, the laser beam source is so oriented. On the other hand, for the observation optical system, the part of the laser beam L polarized in the direction perpendicular to the face of FIG. 1 is used. The polarization plate 43 is so disposed. For the wavelength of the laser beam used, the dichroic beam splitter 15 reflects the P-polarized component, while the beam splitter 19 transmits the P-polarized component, further the polarization beam splitter 17 transmits the P-polarized component and reflects the S-polarized component.

Actually, however, the dichroic coating has a limit determined by the refraction index of the evaporated material, so that it is difficult to achieve the above described characteristics. For example, when a parallel plane type beam splitter is used as the beam splitter 19 instead of the prism type beam splitter, it is difficult to provide the above described characteristics for the P-polarization component and for the S-polarization component. The particular cause for this problem is the fact that the wavelength of the beam from the laser source 11 and that of the light from the observation light source 40 are different. The characteristics of the beam splitter 15 must be considered with the view to plural kinds of wavelength. This is a limit to the latitude of the design of the apparatus. In addition, two light sources which are used make the structure complicated.

SUMMARY OF THE INVENTION

Accordingly, the principal object of the present invention is to provide an observation apparatus by which a sharp and bright image of an object can be observed.

The second object of the present invention is to provide an observation apparatus in which a common wavelength of light is used for a photoelectric detection and for an observation of an image to eliminate the difference in the performances of the optical elements toward the light.

The third object of the present invention is to eliminate stripes which can be caused by a speckle pattern created in the illumination area along a scanning direction.

The fourth object of the present invention is to achieve a clear observation of the alignment marks when two objects having such patterns are to be aligned.

These and other objects, features and advantages of the present invention will become more apparent upon a consideration of the following description of the preferred embodiment of the present invention taken in conjunction with the accompanying drawings.

DESCRIPTION OF THE PREFERRED EMBODIMENT

Figures 3, 4:
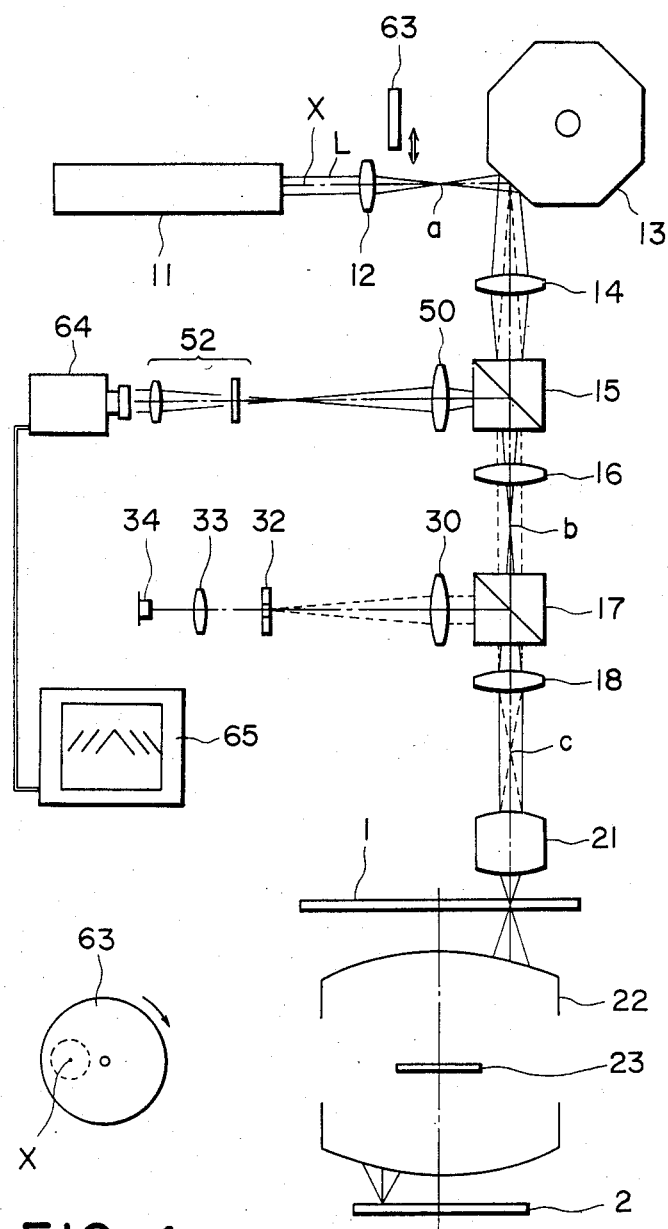
FIG. 3 shows an optical system of an observation apparatus according to another embodiment of the present invention.
FIG. 4 shows a plan view of an element used in FIG. 3 embodiment.

The present invention will now be described in conjunction with FIGS. 2, 3 and 4. In FIGS. 2 and 3, the elements having the function similar to those of FIG. 1A elements are assigned the same reference numerals.

Figures 1A, 1B:
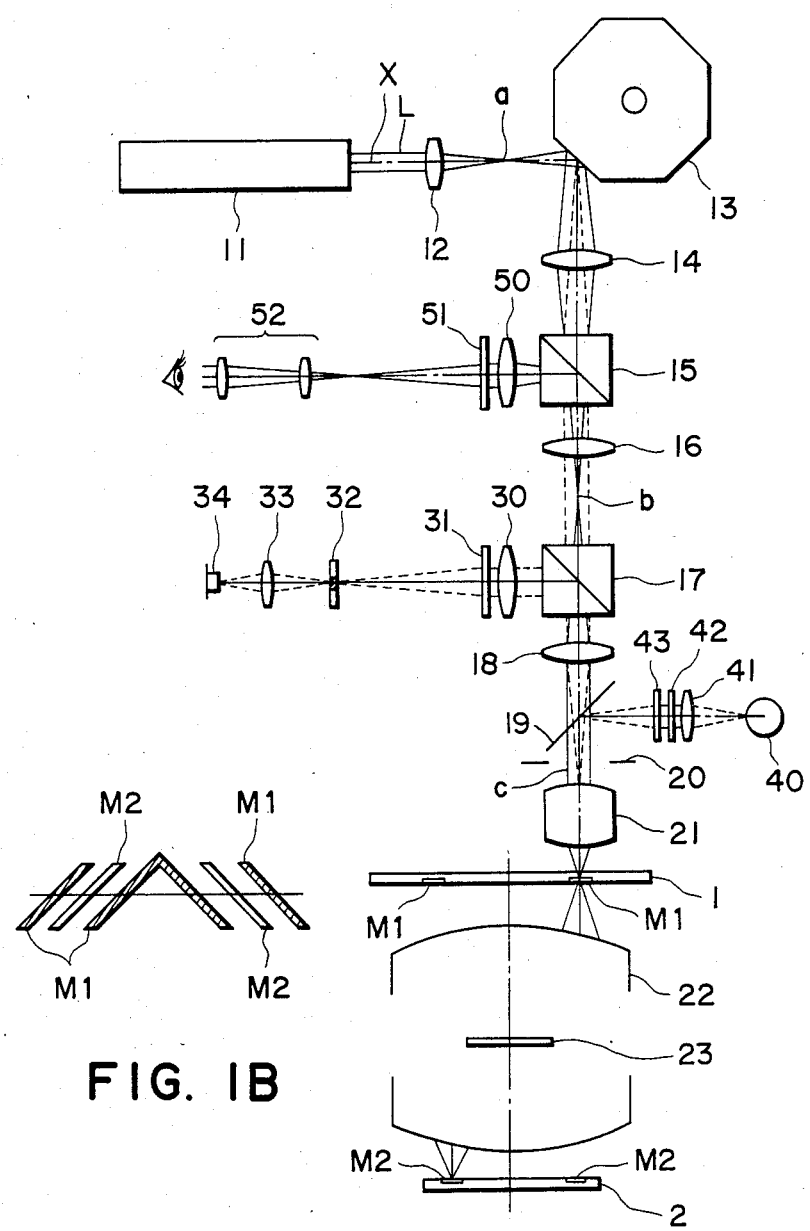
FIG. 1A shows an arrangement of a prior art optical system for an automatic alignment apparatus.
FIG. 1B shows an example of alignment marks.
Figure 2:
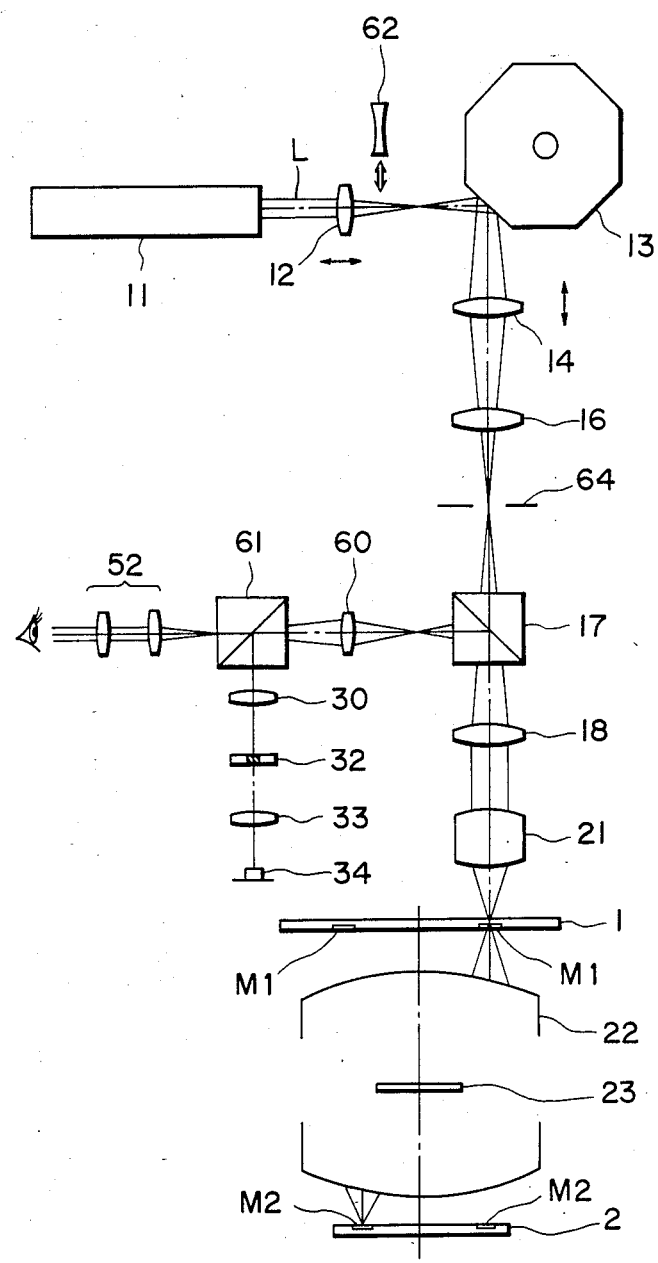
FIG. 2 shows an optical system of an observation apparatus according to an embodiment of the present invention.

In FIG. 2, similarly to FIG. 1A, there are provided laser source 11, a condenser lens 12 and a polygonal mirror 13 along the optical path for the laser beam L produced by the laser source 11. Further, along the optical axis for the beam deflected by the polygonal mirror 13, there are provided an f-θ lens 14, a field lens 16, slit 64, a polarization beam splitter 17 for dividing a reflected beam into a beam toward an observation optical system and toward a photoelectric detection optical system, a relay lens 18 and an objective lens 21 in the order named. At the point where the laser beam L is imaged, there is a mask 1, which is optically conjugate with a wafer 2 through an imaging optical system 22, such as a reduction projection lens system, within which there is provided a λ/4 plate 23.

Along the optical axis for the reflected beam which is divided out by the polarization beam splitter 17, there are provided an imaging lens 60 and beam splitter 61.

Along the optical path for the beam L transmitted by the beam splitter 61, there is an erector 52 providing for observation by human eyes. For the beam divided out by the beam splitter 61, there are provided an imaging lens 30, a partial light blocking plate 32, a condenser lens 33 and a photoelectric transducer 34. Between the condenser lens 12 mentioned hereinbefore and the polygonal mirror 13, a light diffusing lens 62 consisting of a concave lens is retractably inserted.

For the aligning operation, similarly to the apparatus of FIG. 1A, the laser beam L from the laser source 11 is condensed on the mask 1 and the wafer 2. Assuming that the direction of polarization of the laser beam is parallel to the face of FIG. 2, the laser beam L which has reached the wafer 2 through the λ/4 plate 23 and then been reflected by the wafer and further passed through the λ/4 plate 23 is polarized in the direction perpendicular to the face of the Figure. The characteristics of the polarization beam splitter 17 are such that it allows all of P-polarization component to pass therethrough, while it reflects all of S-polarization component. The characteristics of the beam splitter 61 are so selected, for example, that it reflects approx. 95% of the S-polarized component, whereby 95% of the reflected laser beam L can be received by a photoelectric transducer 34.

When the light diffusing lens 62 is set outside the optical path, the laser beam L forms a spot or a short bar illumination area on the surface to be scanned, so that only a part of the area can be seen by the observation optical system. In order to allow the observation of a wider range, the scanning beam is required to illuminate a wider area. The light diffusing lens 62 provides means for satisfying this requirement. It is retracted from the optical path of the laser beam L, when the alignment operation is performed using the photoelectric transducer 34, so as not to influence the imaging of the beam. But, it is inserted thereinto upon when observation is desired so as to diffuse the laser beam to enlarge the illumination area. It is added here that the reason why the characteristics of the beam splitter 61 are so selected that it reflects 95% of the S-polarized beam and transmits 5% thereof is that the laser beam is of such a high brightness that 5% is enough for observation.

Instead of inserting the light diffusing lens 62 to diffuse the laser beam which otherwise forms a spot on the pattern surface of the mask 1, the condenser lens 12 or f-θ lens 14 may be moved along the optical axis to provide a defocussed illumination, i.e., not condensed on the mask 1.

In addition, to avoid a pattern of stripes created in the illumination area when the diffusing lens 61 is inserted, the lens 62 may be vibrated in the direction perpendicular to the optical axis.

The embodiment of FIG. 2 uses an observation optical system for the operator's observation with the eye piece. But, it is a possible alternative to use a TV camera or other image pick-up element placed behind the eye piece and to enable the operator to observe an image thereof on the TV display. In view of the regulations or the like for the safety when a laser beam is used, it is advantageous to indirectly observe the image on the display through the image pick-up element. If a highly sensitive image pick-up element is used, the quantity of light passed through the beam splitter 61 can be reduced, and correspondingly, the quantity of light transmitted therethrough can be increased, so that the level of the signal gained by the photoelectric transducer 34 can be made almost equal to that gained by the FIG. 1A arrangement.

Instead of the diffusing lens 62, a diffusion plate having no lens function may be used. In this case, the diffusion plate is preferably placed adjacent to a position conjugate with the mask 1 or before the condense lens 12.

FIG. 3 shows another embodiment wherein such a diffusion plate 63 is inserted adjacent a position conjugate with the mask 1. The beam splitter 15 is located at substantially the same position as with the FIG. 1A arrangement. The observation optical system is disposed at the reflected side thereof. When the laser beam L is incident on the diffusing plate 63, a speckle may be produced so that random interference fringes are formed, which hamper observation. In this example, this is eliminated by the scanning operation of the polygonal mirror 13, i.e., the scanning operation fringes uniform. In other words, the surface is scanned with the speckle of the laser beam created by the diffusion plate 63 for the purpose of the observation.

When fine particles are used for the diffusing plate 63, it is difficult to make uniform the speckle in the component in the direction perpendicular to the scanning direction. So, it may be observed as non-uniform brightness in the field seen. This can be eliminated by vibrating the diffusing plate 63. The polygonal mirror 13 deflects the laser beam 2 in the plane parallel to the face of FIG. 3. The diffusing plate 63 may well be finely vibrated in the direction perpendicular to the plane of the deflection, i.e., perpendicular to the face of FIG. 3, or may well be rotated so that the marginal area comes across the laser beam, using the structure shown in FIG. 4. The vibration, however, is not necessary if the speckle formed is sufficiently random. The characteristics of the beam splitters 15 and 17 are so determined that both the photoelectric detection system and the observation system can receive the proper quantity of light. It should be noted that the optical system may be designed with respect to a single wavelength of the beam so that it is easy to provide such desired characteristics. Since the brightness of the laser beam L from the laser source 11 is high, most of the beam can be used for the photoelectric detection. Designated by reference numeral 64 is a TV camera; and 65a, TV display.

In the foregoing embodiments, a He-Ne laser is used as the laser beam, but a He-Cd laser or semiconductor laser may be used in place thereof, using the same principle. Also, the present invention is applicable to a beam of wavelength outside the visible range, if an image pick-up tube sensitive to such a beam is used.

In the case of the semiconductor circuits manufacturing aligner, the object to be observed is a wafer coated with a photoresist, or the like. When the photoresist is sensitive to the laser beam, the area within which the laser beam is incident has to be limited since otherwise the IC circuit pattern area may undesirably be exposed to the alignment scan beam. To achieve this, in the FIG. 2 embodiment a slit 64 is provided at or adjacent a position which is conjugate with the mask 1 to limit the scanning area.

As a laser source having such a sensitive wavelength range, there is a He-Cd laser, which has a wavelength (441.6 nm) near that of the light for the pattern exposure, e.g. g-radiation of a supervoltage Hg lamp (436 nm). Therefore, it is advantageous to use the He-Cd laser in a projection type alignment and exposure apparatus, since the mask, reticle, or wafer can be directly observed by the beam having the wavelength near the pattern exposure alignment. By using the He-Cd laser, a known technique of exchanging a part of the optical system when the alignment operation is carried out, is made unnecessary, which exchange has been needed because of the chromatic aberration. Since the exchange inherently involves more or less the problem of the error in placement, the He-Cd laser is advantageous. Also, since the wavelength of the He-Cd laser is shorter than that of e-radiation (546 nm) which has heretofore been used, the resolution in observation is also improved. Particularly, in the system which uses so-called deep UV having not more than 300 nm wavelength, the accuracy of alignment can be increased correspondingly to the increase of the resolution.

As described in the foregoing, according to the present invention, the laser beam which has heretofore been used for the photoelectric transducer is used also for the observation so that the optical system is made simple. When the light diffusing plate is used, the surface is scanned with the speckle pattern to avoid the influence of the interference peculiar to a laser beam. If necessary, the diffusing plate may be vibrated to eliminate the non-uniformness in the direction perpendicular to the scanning direction.

While the invention has been described with reference to the structures disclosed herein, it is not confined to the details set forth and this application is intended to cover such modifications or changes as may come within the purpose of the improvements or the scope of the following claims.

What is claimed is:

1. An apparatus comprising:
a light source for producing a laser beam;
optical condensing means for constituting a condensing optical path to condense the laser beam onto an object;
scanning means for deflecting the laser beam to scan the object therewith;
means for observing the object;
means for receiving the beam reflected by the object and producing an electric signal; and
means for diffusing the laser beam before scanning when the object is observed through said observing means.

2. An apparatus comprising:
a light source for producing a laser beam;
illumination means for constituting an illumination optical path to illuminate an object with the laser beam;
scanning means for deflecting the laser beam to scan the object therewith;
means for observing the object; and
means for diffusing the laser beam before scanning when the object is observed through said observing means, which is mounted for movement substantially perpendicular to the illumination optical path into the illumination optical path.

3. An apparatus comprising:
a light source for producing a laser beam;
optical condensing means for constituting a condensing optical path to condense the laser beam onto an object;
scanning means for deflecting the laser beam to scan the object therewith;
means for observing the object;
means for receiving the beam reflected by the object and producing an electric signal; and
means for diffusing the laser beam when the object is observed through said observing means.

4. An apparatus according to claim 3, wherein said diffusing means is mounted for movement into the optical path.

5. An apparatus according to claim 4, wherein said diffusing means includes a lens.

6. An apparatus according to claim 4, wherein said diffusing means includes a diffusion plate.

7. An apparatus according to claim 6, wherein said diffusion plate is mounted for vibration in a direction generally perpendicular to the optical path.

8. An apparatus according to claim 7, wherein said diffusion plate is mounted for rotation about an axis generally parallel to the optical axis.

9. An apparatus according to claim 3, further comprising imaging means mounted in the optical path for bringing the object and another object into optically conjugate relation.

10. An apparatus according to claim 9, wherein said imaging means is a reduction projection lens.

11. An apparatus according to claim 9, wherein said diffusing means is mounted for insertion across the optical path when the object is observed through said observing means.

12. An apparatus comprising:
a light source for producing a laser beam;
illumination means for constituting an illumination optical path to illuminate an object with the laser beam;
scanning means for deflecting the laser beam to scan the object therewith;
means for observing the object; and
means for diffusing the laser beam when the object is observed through said observing means, which is mounted for movement substantially perpendicular to the illumination optical path into the illumination optical path.

13. An apparatus according to claim 12, wherein said diffusing means is mounted for insertion into the illumination optical path when said observing means is operated and for retraction from the illumination optical path when said observing means is not operated.

14. An apparatus according to claim 12, further comprising imaging means mounted in the optical path for bringing the object and another object into optically conjugate relation.

15. An apparatus according to claim 12, wherein said diffusing means includes a refractive optical element.

16. An apparatus according to claim 12, wherein said diffusing means includes a diffusion plate.

17. An apparatus according to claim 16, wherein said diffusion plate is mounted for vibration in a direction generally perpendicular to the optical path.

18. An apparatus according to claim 16, wherein said diffusion plate is mounted for rotation about an axis generally parallel to the optical axis.

19. An apparatus according to claim 13, wherein said laser beam is condensed on the object, when said diffusing means is retracted from the illumination optical path.

20. An apparatus comprising:
a light source for producing a laser beam;
illumination optical means for illuminating an object with the laser beam, said illumination optical means including at least one optical element movable along an optical axis between a first position to condense the laser beam on the object and a second position to illuminate the object with the laser beam which is diffused thereby:

scanning means for scanning the object with the laser beam;

means for observing the object; and means for receiving the beam reflected by the object and producing an electric signal.

21. An apparatus according to claim 20, further comprising imaging means mounted along the optical axis for bringing the object and another object into optically conjugate relation.

22. An apparatus according to claim 20, wherein said optical element is mounted to be placed at its first position when said beam receiving means is operated, and is mounted to be placed at its second position when said observing means is operated.

23. A method comprising:

producing a laser beam;

constituting a condensing optical path to condense the laser beam onto an object;

deflecting the laser beam to scan the object therewith;

observing the object;

receiving the beam reflected by the object and producing an electric signal; and diffusing the laser beam before the deflection step when the object is observed.

24. A method comprising:

producing a laser beam;

constituting a condensing optical path to condense the laser beam onto an object;

deflecting the laser beam to scan the object therewith;

observing the object;

receiving the beam reflected by the object and producing an electric signal; and diffusing the laser beam when the object is observed.

* * * * *